(12) United States Patent
Whitehill et al.

(10) Patent No.: US 6,708,329 B1
(45) Date of Patent: Mar. 16, 2004

(54) METHOD AND APPARATUS FOR PRODUCING MODULES COMPATIBLE WITH A TARGET SYSTEM PLATFORM FROM SIMULATION SYSTEM MODULES UTILIZED TO MODEL TARGET SYSTEM BEHAVIOR

(75) Inventors: Eric A. Whitehill, Fort Wayne, IN (US); Daniel E. Stir, New Haven, IN (US); Eric D. White, Fort Wayne, IN (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 0 days.

(21) Appl. No.: 09/580,194

(22) Filed: May 26, 2000

(51) Int. Cl.$^7$ .............................. G06F 9/44; G06F 9/45
(52) U.S. Cl. ...................................... 717/136; 717/135
(58) Field of Search .................. 717/135, 136–148, 717/131–133; 703/22

(56) References Cited

U.S. PATENT DOCUMENTS

| | | | | |
|---|---|---|---|---|
| 5,313,614 A | * | 5/1994 | Goettelmann et al. | 717/138 |
| 5,577,233 A | * | 11/1996 | Goettelmann et al. | 703/26 |
| 5,724,590 A | * | 3/1998 | Goettelmann et al. | 717/154 |
| 5,848,274 A | * | 12/1998 | Hamby et al. | 717/153 |
| 5,943,322 A | | 8/1999 | Mayor et al. | |
| 5,946,474 A | * | 8/1999 | Skogby | 703/13 |
| 6,297,820 B1 | * | 10/2001 | Bloem et al. | 345/763 |

FOREIGN PATENT DOCUMENTS

WO    WO 9/01816    1/1999

OTHER PUBLICATIONS

"OPNET Modeler", MIL3 Website, 14 pages, 2000.
"COSSAP Design Environment", Synopsis Website, 7 pages, Apr. 12, 1999.
"Turning Algorithms into the Right Hardware Architectures for ASICs", Cadence Design Systems, pp. 1–8, 1999.
"Cierto SPW Model Manager", Cadence Design Systems, Inc., 1999.
"VxWorks 5.2", Wind River Systems Website, 8 pages, 2000.
"VxWords 5.4", Wind River Systems, pp. 1–4, 1999.

* cited by examiner

Primary Examiner—Wei Zhen
(74) Attorney, Agent, or Firm—Edell, Shapiro & Finnan, LLC

(57) ABSTRACT

Modules produced and utilized for system simulation are translated by a computer system into software modules compatible with and executable on a target system platform. Initially, software is typically produced to enable a modeling tool to simulate a new design and target system behavior. The simulation software basically includes functions performed by the corresponding target system. The computer system of the present invention translates modules associated with the simulation to software modules compatible with and executable on a target system platform. The translated modules are subsequently compiled and downloaded to the target system. The present invention enables direct transition from simulation to a software implementation.

34 Claims, 4 Drawing Sheets

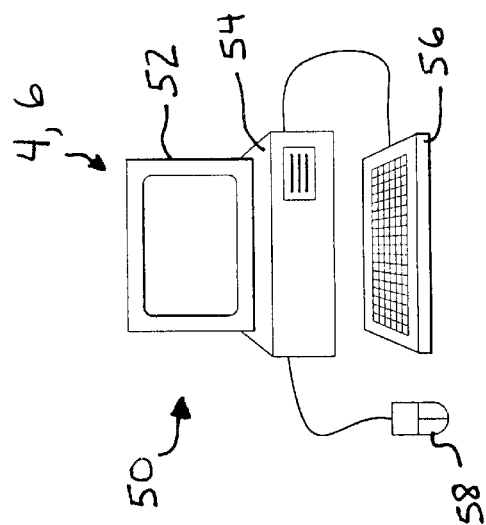
FIG.3
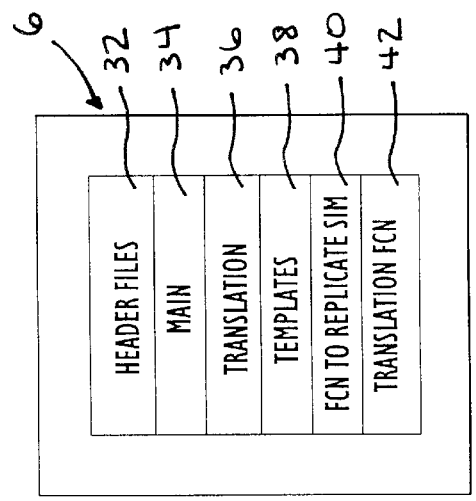
FIG.4
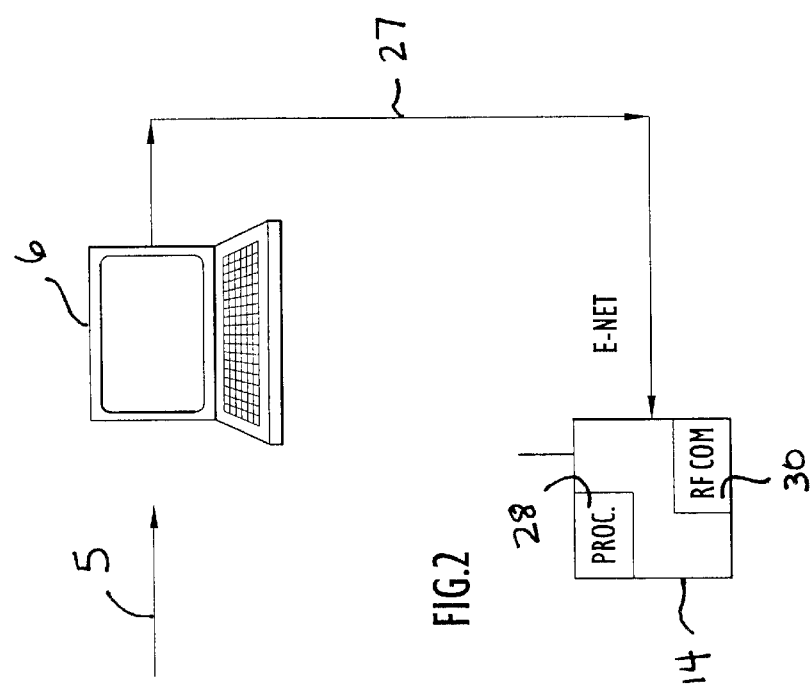
FIG.2
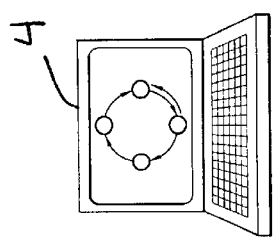

METHOD AND APPARATUS FOR PRODUCING MODULES COMPATIBLE WITH A TARGET SYSTEM PLATFORM FROM SIMULATION SYSTEM MODULES UTILIZED TO MODEL TARGET SYSTEM BEHAVIOR

BACKGROUND OF THE INVENTION

1. Technical Field

The present invention pertains to software conversion or translation systems. In particular, the present invention pertains to a computer system for translating simulation system modules utilized to model behavior of a target system into modules compatible with a target system platform for controlling the target system to act in accordance with the simulation.

2. Discussion of Related Art

Network protocol development generally includes a combination of creativity and science. Initially, a protocol design is conceived and modeled or simulated to verify design operation and feasibility. Several modeling tools are commonly available to simulate communications and evaluate and predict performance. For example, OPNET, available from MIL 3, Inc. of Washington, D.C., is a versatile communications modeling tool that is based upon the 'C' programming language and provides simulation of network protocols. SPW and COSSAP, respectively available from Cadence Design Systems, Inc. of San Jose, Calif. and Synopsys, Inc. of Mountain View, Calif., are other common simulators, but are primarily directed toward digital signal processing applications. As such, these simulators are limited in relation to the network simulation provided by OPNET.

Generally, system designers generate modules that create a software model of a new protocol concept or design for evaluation on a simulation or modeling tool. Once the concept is created and simulated results are evaluated, system requirements and design phases are commenced to produce a detailed design of a system employing the protocol. Software development proceeds from the detailed system design to generate software for use on target system hardware in order to complete a prototype. The prototype is tested and compared to the model and simulated results to insure that the prototype and model function in accordance with each other and the original protocol design concept. These comparisons typically indicate performance differences between the prototype and model which are analyzed and corrected. When the prototype and model coincide, the product is available for demonstration and production.

The above-mentioned process suffers from several disadvantages. In particular, the above-described process requires system designers and software developers to independently produce simulation and target system software, each directed toward system operation. This causes duplication of effort and requires extensive verification of the simulation and prototype system, thereby substantially increasing time to market and system development costs. Further, if the simulation and prototype produce different results, additional time and expense must be incurred in order to analyze and correct the differences. Moreover, simulators, such as OPNET, do not produce software or code for hardware devices, thereby facilitating the duplicated software development efforts described above.

Although SPW has some code generation capability, the generated code is in the form of a hardware design language and is utilized to facilitate hardware realization. Further, the SPW simulator is primarily directed toward signal processing applications, and, therefore is generally not applicable or severely limited for network protocol applications. COSSAP similarly provides code generation capability, but for digital signal processors. The code is generated based on block diagrams constructed by the system designer via tools within COSSAP, thereby limiting code generation to particular code segments that correspond to the block diagram constructs permitted by the COSSAP system. Moreover, COSSAP is primarily directed toward digital signal processing applications (e.g., modem design) and is typically utilized to simulate band pass and low pass filters, modulators and radio frequency (RF) device functions that are generally performed by a digital signal processor (e.g., generates code to implement a Fast Fourier Transform (FFT) on a digital signal processor). As such, COSSAP is generally not applicable or severely limited with respect to network protocol development.

Thus, the present invention takes full advantage of protocol development capabilities of simulation tools. Since reduction of time to market is critical, the present invention drastically reduces that time and development costs by facilitating direct transition from the modeling tool to a software implementation for demonstration and production. In other words, the present invention translates modules associated with the simulation into software modules compatible with and executable on a target system platform. The software developed by system designers for simulation purposes is utilized by the present invention to derive software modules for execution on the target system platform, thereby ensuring that the model and target system are aligned and obviating the cost and time incurred for software development and model verification. In addition, the present invention enables the simulation system to be further utilized for system requirements and definitions and software development.

OBJECTS AND SUMMARY OF THE INVENTION

Accordingly, it is an object of the present invention to facilitate direct transition from a system modeling tool to a software implementation executable on a target system platform for demonstration and production.

It is another object of the present invention to translate modules utilized for system simulation to software modules compatible with and executable on a target system platform, thereby enhancing software development and reducing overall system development time and costs.

Yet another object of the present invention is to ensure alignment of simulation and target system results by deriving software modules for a target system platform from modules utilized for system simulation.

The aforesaid objects may be achieved individually or in combination, and it is not intended that the present invention be construed as requiring two or more of the objects to be combined unless expressly required by the claims attached hereto.

According to the present invention, modules produced and utilized for system simulation are translated by a computer system into software modules compatible with and executable on a target system platform. Initially, a project lifecycle for developing network protocols includes designing an initial protocol concept or design, simulating the design utilizing a modeling or simulation tool, developing software for a target system and verifying target system operation against the simulation. In order to simulate the initial design, software is typically produced to enable the modeling tool to simulate target system behavior. The simulation software basically includes functions performed by the corresponding target system. The computer system of the present invention translates modules associated with the simulation to software modules compatible with and executable on a target system platform. The translated modules are in the form of source code files that are compiled and downloaded to the target system. Thus, the present invention enhances the software development phase of the lifecycle by directly transitioning from simulation to a software implementation.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

BRIEF DESCRIPTION OF THE DRAWINGS

FIG. 2 is a diagram of a translation system receiving simulation modules and providing target modules to target system hardware according to the present invention.

FIG. 3 is a view in perspective of an exemplary computer system implementing the translation and simulation systems of FIG. 2.

FIG. 4 is a block diagram of translation software components within the translation system of FIG. 2.

DETAILED DESCRIPTION OF THE PREFERRED EMBODIMENTS

Figure 1:
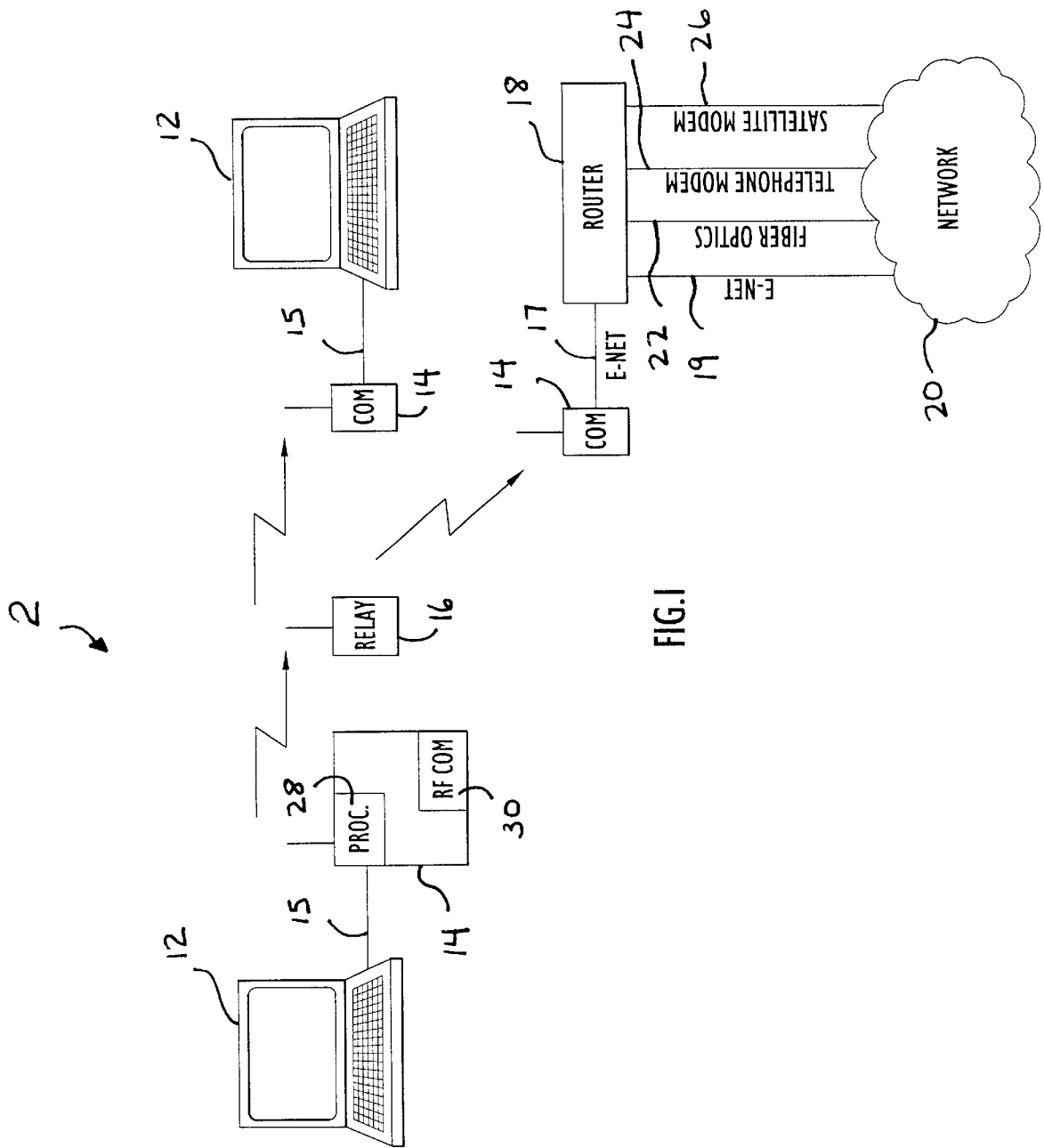
FIG. 1 is a diagram of an exemplary communication system employing the present invention to facilitate transition from simulation to a software implementation.

An exemplary communication system utilizing network protocols and employing the present invention is illustrated in FIG. 1. Specifically, system 2 includes host systems 12, communication devices 14, a communication relay 16, a router 18 and a network 20. Host systems 12 are each preferably implemented by a conventional computer system (e.g., IBM-compatible, Apple, laptops, palm pilots, e-mail device, etc.) and coupled to a corresponding communication device 14 via an Ethernet connection 15. Communication devices 14 facilitate wireless communication, and are generally of the type disclosed in U.S. Pat. No. 5,943,322 (Mayor et al), the disclosure of which is incorporated herein by reference in its entirety. Relay 16 is substantially similar to communication devices 14 and is utilized to receive and re-transmit communication device signals to enhance the communication range of system 2. Router 18 is preferably implemented by a conventional routing device and is connected to a corresponding communication device 14 via an Ethernet connection 17 and to network 20. The network is preferably implemented by a wide area network (WAN), such as the Internet, and communicates with router 18 via various types of connections and/or devices (e.g., Ethernet connection 19, fiber optic connection 22, telephone modem 24, satellite modem 26, etc.). Host systems 12 may communicate directly with each other or with network 20 (e.g., Peer to Peer Networking) via communication devices 14 and/or relay 16.

Communication system 2 may employ a custom network protocol to facilitate communication by host systems 12. The protocol is primarily implemented by communication devices 14 and relay 16 that each include a network processor 28 and an RF communications device 30 (e.g., an RF modem). The network processor preferably includes an Intel Pentium or compatible processor, and is coupled to the RF communications device via a PCI bus (not shown). The RF devices transmit and receive messages in the form of RF signals, while the network processors include software to facilitate message delivery and to process data in accordance with the protocol, thereby enabling communication across the system.

Various network protocols may be developed for use with system 2 or other communications networks, and the present invention is directed toward enhancing network protocol development and implementation. Initially, a common project lifecycle for developing network protocols typically includes various phases, such as protocol design and simulation, software development, test and verification. In particular, a network protocol concept is initially designed and simulated on a simulation or modeling tool. Software modules in the form of source code are produced and developed in accordance with the design, and basically include functionality of system components. The software and other modules associated with the simulation (e.g., collectively referred to herein as simulation modules) are utilized by the simulation tool to simulate the designed protocol. The simulation modules may be refined during simulation to achieve desired performance and/or results. Once the simulation is verified, system requirements and detailed design generally commences to direct development of software for actual system hardware (e.g., commonly referred to as a target system). The target system is subsequently tested and compared to the simulation to verify target system operation. The software development and test phases for the target system are independent of the software produced for simulation, and basically duplicate that effort. However, according to the present invention, the simulation modules are directly translated into target modules (e.g., modules compatible with and executable on a target system platform), thereby enabling the simulation tool to be utilized for system definition and requirements and software development. An exemplary configuration for translating the simulation modules to target modules is illustrated in FIG. 2. Specifically, the configuration includes a simulation system 4, a translation system 6 and RF communications device 14 having network processor 28 serving as the target device. Simulation system 4 is coupled to translation system 6 via a network or other communications medium 5. The simulation system is preferably implemented by a conventional computer system and includes a simulation tool to model target system behavior. Software modules are developed for the simulation tool that provide the tool with functions for system components. By way of example only, the simulation tool employed by simulation system 4 is OPNET, available from MIL 3, Inc. of Washington, D.C. This simulation tool basically enables network topologies to be entered by specifying network nodes and links. The nodes represent network communication sources and destinations, while the links represent communication facilities between network nodes. The OPNET simulation tool enables the user to specify various node and link characteristics and arrange the node and links within the network. The functional aspects of a node are generally indicated by incorporating functional elements within a node. The functionality of the elements are typically indicated in the form of finite state machines that utilize software modules produced by the user to simulate node functions, such as communicating via the designed network protocol (e.g., intranet protocol and link layer protocols that deliver messages via the RF communications device). These modules are typically implemented in the 'C/C++' programming language. However, the present invention may translate modules for any simulation tool in any computer language to target modules for any desired target system.

Translation system 6 is preferably implemented by a conventional computer system and is coupled to communication device 14 and network processor 28 via an Ethernet connection 27. The network processor includes a real time operating system that manages processor resources in a manner compatible with timing requirements of real time applications. By way of example only, the network processor real time operating system is implemented by VxWorks available from Wind River Systems of Alameda, Calif., but any other suitable operating system may be employed.

In order to implement the designed protocol on system 2, appropriate software is developed and downloaded into network processor 28. This software is required to be compatible with the processor and target platform or operating system (e.g., VxWorks). Since software modules are developed for the simulation tool that indicate the protocol functionality, translation system 6 basically processes simulation modules (e.g., the developed software and other modules associated with the simulation) to produce target modules compatible with the processor and target platform that enables the processor to implement the protocol design. In particular, the translation system receives the simulation modules from simulation system 4 via network connection 27. The simulation modules are translated by translation system 6 into target modules compatible with the processor and target platform. The target modules are compiled by translation system 6 and downloaded to processor 28 for execution in target system 2. The Ethernet connection between translation system 6 and communication device 14 is primarily utilized for downloading, and is generally removed during actual operation of communication device 14 within system 2.

Referring to FIG. 3, simulation system 4 and translation system 6 are each preferably implemented by a conventional computer system 50 typically equipped with a monitor 52, base 54 (e.g., including the processor, memories, communications devices, etc.), keyboard 56 and mouse 58. Each computer system is preferably implemented by a SUN workstation, but may alternatively be implemented by a personal computer (e.g., IBM-compatible, Apple, laptop, Palm Pilot, etc.) or any other type of computer system (e.g., mini-computer, microcomputer, mainframe, etc.). The simulation computer system includes software for implementing a simulation tool, such as OPNET, while the translation computer system includes translation and other software as described below. The simulation and translation systems preferably utilize a Unix operating system, but may alternatively include any suitable platform or operating system (e.g., Windows, Macintosh, Unix, Linux, OS2, etc.). Each computer system includes sufficient processing and memory capabilities to effectively execute the respective simulation and translation software and store associated files. The translation system receives the simulation modules in a particular format, such as Unix, and produces target modules in that format for use with the target system. However, the simulation and target modules may be developed and produced in any desired format.

Translation system 6 enables direct transition from simulation or modeling of a design to software implementation for a target system. If the simulated model is appropriately and thoroughly tested and refined to produce desired results, the translated modules produced by the translation system should function in a similar manner on the target system platform. When errors are encountered between actual and simulated results, the translation system is typically modified to correct these errors. Once the simulation modules have been developed and verified by operation of the simulation tool, a file is constructed identifying the items or modules for translation. The translation system software processes the identified simulation modules to produce corresponding target modules compatible with the target system platform. The translation system software components for translating the simulation modules to target modules are illustrated in FIG. 4. Specifically, the translation software includes simulation tool header files 32, a main processing module 34, a translation module 36, templates 38, a set of functions 40 that replicate simulation tool functions and a set of library functions 42. Header files 32 include information describing the simulation tool function library and operating system. These files are utilized to make simulation tool structures (e.g., OPNET state machines) and a simulation tool virtual operating system compatible with target system platform. In addition, the header files generally contain information (e.g., global information) used and referenced by several target modules, and are preferably implemented in the 'C' programming language.

Main processing module 34 facilitates translation of the simulation modules, while translation module 36 effectively translates each word of each simulation module line and places the resulting translated line into a corresponding target module or output file. Templates 38 basically serve as a target module shell or skeleton, and initially contain information and code needed within target modules. For example, a template may initially contain references to global information and the header files, a comment block, and various other information based on the particular type of target module being produced. The templates receive the translated simulation module lines and eventually form the target module. Function set 40 is utilized to replicate on the target system platform simulation tool functions residing within the simulation modules. The function set basically performs substantially the same tasks as the corresponding simulation tool functions, but is modified for compatibility with the target system platform. Function set 40 may further include functions required to emulate various simulation tool features on the target system platform (e.g., packet processing, message queues, state machines, etc.). Translation functions 42 are a set of library functions that facilitate translation of simulation modules as described below.

The translation system processes several simulation modules (e.g., developed software and other modules associated with the simulation tool) to produce the target modules. By way of example only and with respect to the OPNET simulation tool, the translation system receives for translation an external model access (EMA) file (e.g., generally having a file type of '.em.c'), a process file for each node functional element in the model (e.g., generally having a file type of '.pr.c'), a packet file (e.g., generally having a file type of '.pk.m') for each packet format utilized in the simulation, an interprocess communications interface (ICI) file (e.g., generally having a file type of '.ic.m') for each ICI format utilized in the simulation and a model environment file (e.g., generally having a file type of '.ef'). It is to be understood that the translation system may process any types of simulation or other modules or files having information pertaining to the simulation tool employed in order to produce the target modules.

The EMA file is created by the OPNET simulation tool and basically includes code (e.g., preferably implemented in a 'C' language type code) representing the simulated system model. In other words, the EMA file includes certain user generated simulation modules utilized for the simulation, code implementing the simulation tool virtual operating system and code for generating simulation tool state machines. In addition, the EMA file includes information relating to the interaction of node functional elements. The EMA file is generally utilized to build the model independent of the simulation tool, and accounts for portions of simulation modules not implemented in code (e.g., not implemented in the 'C' programming language). For example, the EMA file may describe to the target system platform a simulation tool graphical display of interconnected network elements (e.g., an IP router connected to an Ethernet process via a package stream) and the fact that a connection is required between those elements.

The process files are user generated simulation modules that are compiled by the simulation tool and used to implement node functional element operations and perform the simulation. Each process file basically represents the functions performed by a corresponding node functional element in accordance with a corresponding state machine. The packet file includes information pertaining to a format of a corresponding packet utilized in the simulation. The interprocess communications interface (ICI) is basically a manner of transferring messages between network elements delivering information. The ICI is generally a packet with the ICI file containing information pertaining to a format of a corresponding ICI. The environment file essentially contains information relating to values for the particular environment (e.g., configuration attributes, parameters, etc.).

Figure 5:
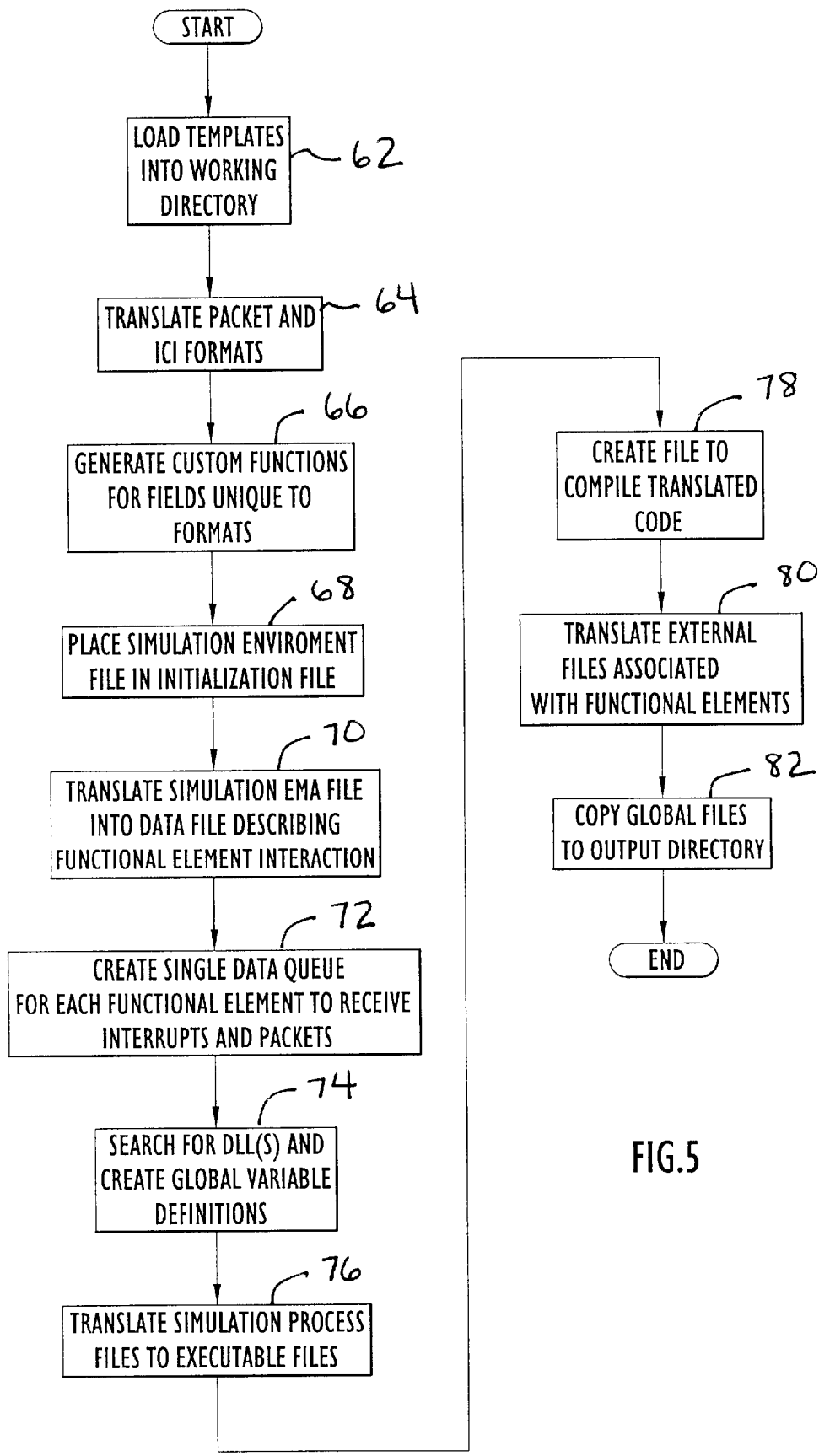
FIG. 5 is a procedural flow chart illustrating the manner in which the translation system translates simulation modules into target modules compatible with and executable on a target system platform according to the present invention.
Figure 6:
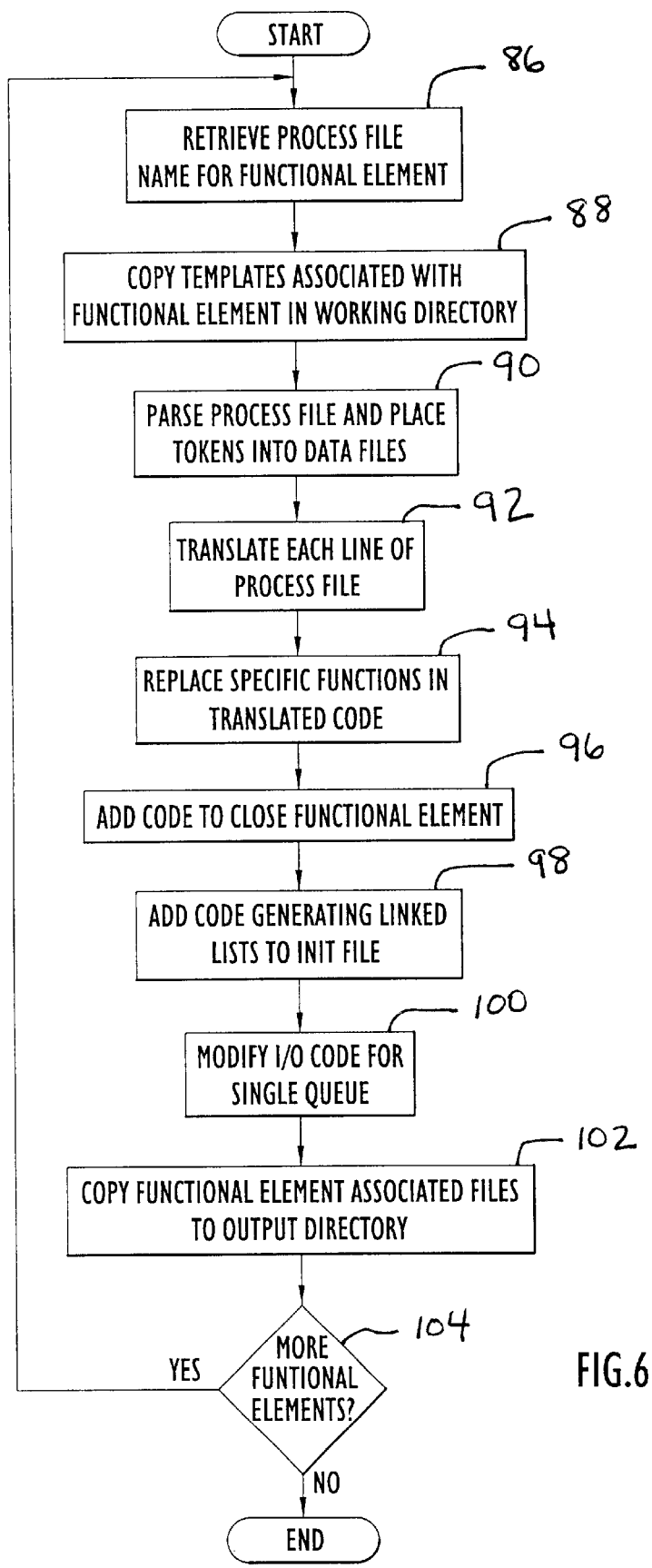
FIG. 6 is a procedural flow chart illustrating the detailed manner in which an individual simulation module is translated to a target module according to the present invention.

The manner in which simulation modules are processed to produce target modules is illustrated, by way of example only, in FIGS. 5–6. Specifically, templates 38 (FIG. 4) are loaded into a working directory at step 62. The templates are essentially the working target modules and receive translated simulation module lines produced by the translation system. The packet and ICI formats are translated at step 64 into respective record structures (e.g., 'C' computer language statements defining record structures) for each format based on information contained in the packet and ICI files. The packet and ICI files are typically in the form of binary files that are processed by the translation system to retrieve the packet and ICI information.

Simulation tool functions may process packet fields based on the name of a field in the form of a character string data type. However, this manner of processing may not be compatible with the target system platform (e.g., VxWorks) and, therefore, a mapping technique is required to identify the packet fields. One such mapping technique may associate the character string name of each format record structure field with a unique number. This mapping permits the target modules to perform specified actions based on each field name (e.g., the target modules may include 'case' statements that logically switch on the unique number to perform actions for the associated field). An array storing the field name and associated number is loaded into the target system memory upon initialization of the target system platform as described below.

Functions that operate on particular packet and ICI formats are custom generated or instantiated at step 66 to accommodate fields unique to the particular format. Basically, packets and ICIs each have attributes common among the various packet and ICI formats, respectively. However, certain packet and ICI formats have unique fields that require custom functions to operate on those fields. The translation system produces code to identify the unique packet and ICI fields and create and invoke the corresponding functions to process these fields. The produced code performs specified actions based on character string field names by utilizing the mapping technique described above (e.g., the code may include 'case' statements as described above).

The environment file, at step 68, is placed within a target system platform initialization file that loads the environment data into a string array during target system platform initialization. This environment data is utilized to derive responses to requests for environment values (e.g., quantity of network nodes, timeout thresholds for message re-transmissions, quantity of re-transmission attempts, or any other desired parameters). The EMA file is translated, at step 70, into a data file that indicates the interaction between each node functional element within the model. This data file typically includes for each node functional element a name, the name of the process file associated with that functional element and a list of other functional elements that can receive data from that element. The data file is utilized at step 72 to create a message queue for each node functional element within the model to receive interrupts and data packets for that functional element. Messages and interrupts are transferred within the target system by the transmitting element placing the information on the receiving element message queue.

The simulation tool may utilize a series of imported files, preferably dynamic link libraries (DLL), to set values for performing simulation tool functions. The translation system at step 74 constructs a target DLL file from the simulation DLL files. In particular, the translation system processes header files 32 to identify imported files or referenced simulation DLL files. Corresponding global variable definitions are produced within the target DLL file based on information within the simulation DLL files with each global variable set to an appropriate value.

Each process file name is retrieved from the translation input file (e.g., the file including items for translation described above) at step 76 and transferred to main module 34 for translation. Referring to FIG. 6, a process file name associated with a functional element is retrieved at step 86. Templates 38 (FIG. 4) associated with the retrieved element are identified and copied within the working directory at step 88. The process file and its dependencies (e.g., files referencing the process file) are parsed into token components (e.g., variables, types, definitions, functions, etc.) at step 90 and placed into data files in order to identify the parsed components during translation and determine appropriate actions for the components. The words within each process file line are retrieved and translated at step 92. The translation system identifies each word and narrows the processing possibilities for that line. When sufficient words of a line are retrieved to determine the function of the line, the appropriate translation functions are accessed from library 42 to perform the actual translation. The resulting translated line is generally similar to or a copy of the original line, but can vary to a complete rewrite of that line, and is stored in the corresponding template. Generally, function calls within the simulation modules to perform simulation tool functions are substantially the same as those within the target modules. However, in order to perform the simulation tool functions on the target system platform, the underlying modules responsive to the function calls have been modified to be compatible with the target system platform. These underlying modules are included within function set 40, and are accessed in response to the function calls within the target modules. In other words, function set 40 essentially replaces the simulation tool functions to perform corresponding functions on the target system platform in response to function calls within the target modules. In addition, certain information within a process file line may be associated with other files and the translation system provides additional processing to translate the associated information (e.g., definition statements may reside in several files and each is identified and processed).

The resulting templates are searched at step 94 to replace specific functions with functions compatible with the target system platform. For example, certain functions in the simulation tool define data streams in a particular manner. These functions are replaced with functions (e.g., typically included within function set 40) for compatibility with the target system platform to enable information to be transferred between functional elements.

The translation system provides additional code for a shutdown function at step 96 to enable the functional element to close or cease operation upon termination of code execution. Basically, the simulation tool performs a one step termination in response to a shutdown of the simulated system, whereas the target system platform, in response to a shutdown, ceases each task in memory individually. Accordingly, the additional code provided by the translation system facilitates the target system platform performing a shutdown in this manner. The message queue of each functional element is preferably implemented by a series of linked lists. The code to create the linked lists for the message queue of the retrieved functional element is produced and added to the target system platform initialization file at step 98. The initialization file basically serves as a boot file for the target system platform and generally contains various information including the packet and ICI field mapping described above (e.g., assigns packet and field numbers and stores that information in an array format).

The resulting target module or template is processed at step 100 to retrieve and modify lines containing simulation tool input/output (I/O) functions. Since the simulation tool typically transfers data between functional elements in a manner transparent to the user (e.g., a two-way packet queuing scheme), a data transfer scheme is required for the target system platform. Accordingly, the retrieved lines are modified to accommodate the message queue arrangement described above, where the message queue for each functional element stores or buffers packets until the element is instructed to process a packet. Further, definitions indicating packet origins are similarly modified to accommodate the above-described message queue arrangement.

Files created for the retrieved functional element (e.g., target module, initialization file, shutdown files, header file, etc.) are closed and copied from the working directory to an output directory at step 102. Generally, the translation system utilizes the working directory as a working memory to translate the retrieved process file. This directory basically contains several individual files that are eventually combined into a single file. The resulting file is copied to an output directory, while the temporary individual files are deleted. If additional functional elements require processing as determined at step 104, the above-described process is repeated. Otherwise, translation processing for the functional element process files is complete.

Referring back to FIG. 5, a compilation file is produced at step 78 to compile the resulting translated files or target modules into an executable library compatible with the target system platform. The compilation file designates the compilation order for the target modules and is derived from a data file containing the names of files created during the translation processing described above. External files associated with each functional element are translated at step 80 in substantially the same manner described above for the functional element process files. These files are external of the simulation tool and primarily contain source code (e.g., preferably in the 'C' computer language) and some simulation tool specific functions. The external files are basically utilized by the simulation tool to perform specific calculations or functions and return a value, thereby avoiding the need to have the functions placed within the simulation modules at each location utilizing the functions. Global files created based on the model are closed and copied from the working directory to the output directory at step 82. The resulting files placed in the output directory are compiled by the translation system and subsequently downloaded for execution on the target system platform as described above. The translation system software is preferably implemented in the 'C/C++' computer language, however, any suitable computer language may be utilized to implement the software.

Operation of the translation system is described with reference to FIGS. 1–2. Initially, a protocol concept or design is created and implemented on a simulation tool of simulation system as described above. Software modules in the form of source code are produced and developed in accordance with the protocol design, and basically include functionality of system components. The software and other modules associated with the simulation (e.g., the simulation modules) are utilized by the simulation tool to simulate the designed protocol. The simulation modules may be refined during simulation to achieve desired performance and/or results.

Once the simulation is verified, the simulation modules are transferred to translation system 6 as described above. The translation system processes the simulation modules as described above (FIGS. 5–6) to produce target modules that are compatible with the target system platform and enable the target system to implement the protocol design. The resulting target modules are compiled by translation system 6 and downloaded to a target device (e.g., network processor 28) as described above for execution in the target system.

It will be appreciated that the embodiments described above and illustrated in the drawings represent only a few of the many ways of implementing a method and apparatus for producing modules compatible with a target system platform from simulation system modules utilized to model target system behavior.

The host, simulation and translation systems may be implemented by any type of personal or other computer or processing system having any suitable platform or operating system. The communication devices and relay may be implemented by any conventional or other type of communication devices (e.g., wired, wireless, etc.). The network may be implemented by any type of communications network (e.g., LAN, WAN, Internet, etc.) and may be accessible via any types of communication medium or devices.

The simulation system may be a stand alone system or may be coupled to the translation system via any communications medium (e.g., network, modem, direct connection, etc.). The simulation modules may be transferred from the simulation system to the translation system via the communications medium or via storage of the modules on transportable storage devices (e.g., floppy disk, CD ROM, DVD, zip drive disk, etc.). The simulation system may include any type of conventional or other simulation tool utilizing software and/or other modules to perform a simulation. The simulation modules may be implemented in any suitable computer language and have any desired formats.

The translation system may be a stand alone system, or may be coupled to the simulation system and/or target device in any combination via any suitable communications medium (e.g., network, modem, direct connection, etc.). The target modules may be transferred from the translation system to the target device via the communications medium or via storage of the modules on transportable storage devices (e.g., floppy disk, CD ROM, DVD, zip drive disk, etc.). The translation system may translate any quantity of simulation modules or files having any types of information to produce any quantity of output or target modules. The target modules may be produced in any suitable computer languages or desired formats, and compatible with any target system platform or device. Further, the translation system may utilize any quantity of DLL or other types of data files.

The target system may be any system capable of utilizing the simulated design and may utilize any suitable platform or operating system. The translation system or target platform may employ any suitable mapping scheme to identify fields by any data types, and may employ any type of message transfer scheme to facilitate message transfer within the system (e.g., message queues, two-way queuing scheme, etc.). The message queues may be implemented by any suitable data structures (e.g., linked lists, queues, stacks, arrays, etc.), while mapping data may be stored in any suitable data structure.

It is to be understood that the translation system may be implemented by any type of computer or processing system including software developed in any suitable computing language performing the above-described functions. The various module and other data (e.g., translated lines, target modules, module line components, etc.) may be stored in any quantity or types of file, data or database structures. Further, the translation software may be developed in any of the above described or other computer languages by one of ordinary skill in the art based on the functional description disclosed in the specification and flow charts illustrated in the drawings. Moreover, the translation software may be available or distributed via any suitable medium (e.g., stored on devices such as CD-ROM and diskette, downloaded from the Internet or other network (e.g., via packets and/or carrier signals), downloaded from a bulletin board (e.g., via carrier signals), or other conventional distribution mechanisms).

The translation software may be installed and executed on a computer system in any conventional or other manner (e.g., an install program, copying files, entering an execute command, etc.). The translation software and other algorithms described above and/or illustrated in the drawings may be modified in any fashion capable of performing the above-described functions. In addition, the description herein of software performing specific functions relates to a computer or processing system performing those functions under software control.

The functions associated with the present invention (e.g., simulation, translation, compilation, downloading, etc.) may be performed on any quantity of computer or other processing systems. Further, the specific functions may be assigned to one or more of the computer systems in any desired fashion.

The present invention is not limited to the specific applications disclosed herein, but may be utilized for software development of any system to directly transition from simulation to a software implementation. Thus, the present invention may be utilized to translate simulation modules utilized with any type of simulation system to target modules for any desired target system or platform.

From the foregoing description it will be appreciated that the invention makes available a novel method and apparatus for producing modules compatible with a target system platform from simulation system modules utilized to model target system behavior wherein simulation modules are directly translated to target modules compatible with and executable on a target system platform.

Having described preferred embodiments of a new and improved method and apparatus for producing modules compatible with a target system platform from simulation system modules utilized to model target system behavior, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. A translation system for producing target modules compatible with a target system from modules utilized by a simulation tool of a simulation system to simulate target system behavior, said translation system comprising:

a module storage unit for receiving and storing simulation system modules, wherein said simulation system modules include information indicating characteristics and functionality of said target system and are compatible with and utilized by said simulation tool to simulate said target system; and a module processor for translating said received simulation system modules into corresponding target modules compatible with said target system, wherein said target modules control said target system to operate in accordance with said target system simulation.

2. The translation system of claim 1 wherein:

said target system includes a communications network;

said simulation tool includes a network simulator to simulate said communications network, wherein said simulation system modules include information indicating a network protocol for use by said communications network; and said target modules control said communications network to implement said network protocol in accordance with said communications network simulation.

3. The translation system of claim 1 wherein said simulation system includes an OPNET simulation tool, and said simulation system modules are compatible with and utilized by said OPNET simulation tool.

4. The translation system of claim 1 wherein said target system includes a VxWorks platform, and said target modules are compatible with said target system platform.

5. The translation system of claim 1 wherein:

said simulation system modules include data simulation modules containing information related to characteristics of said target system and functional simulation modules containing information related to functionality of said target system; and said module processor includes:
- a data translation module for processing said data simulation modules to produce corresponding target modules compatible with said target system; and
- a functional translation module for translating said functional simulation modules into corresponding target modules compatible with said target system.

6. The translation system of claim 5 wherein said functional translation module includes:
- a retrieval module for retrieving each functional simulation module from said received simulation system modules;
- a parsing module for parsing each line of said each retrieved functional simulation module into its individual components;
- a determining module for determining a function of said each parsed line based on its individual components, wherein said determining module includes a component module for retrieving said individual components of said each parsed line successively until sufficient information is retrieved to determine said function of that parsed line;
- a conversion module for converting said each parsed line into a corresponding translated line compatible with said target system in accordance with said determined function of that parsed line; and
- a storage module for storing each translated line associated with a corresponding parsed line in a corresponding target module.

7. The translation system of claim 5 wherein said functional translation module includes:
- a replacement module for replacing specific information within said target modules with information compatible with said target system; and
- a modification module for modifying information within said target modules pertaining to input/output functions to facilitate input/output functions in a manner compatible with said target system.

8. The translation system of claim 1 wherein said module processor includes:
- translation data files including information utilized and referenced by said target modules;
- a translation function module for translating said simulation system modules into said corresponding target modules;
- target template modules for containing target module information and storing corresponding translated simulation system modules received from said translation function module, thereby serving as said target modules; and
- a simulation function module for emulating simulation system functions on said target system, wherein said target modules access said simulation function module in order to control said target system to perform said simulation system functions.

9. The translation system of claim 1 further including:
- a compilation order module for determining a compilation order for said target modules and storing said compilation order in a compilation order file.

10. The translation system of claim 9 further including:
- a compiler for compiling said target modules into a format for execution on said target system in accordance with said compilation order stored in said compilation order file.

11. A program product apparatus having a computer readable medium with computer program logic recorded thereon for producing target modules compatible with a target system from modules utilized by a simulation tool of a simulation system to simulate target system behavior, said program product apparatus comprising:
- a translation storage module for receiving and storing simulation system modules, wherein said simulation system modules include information indicating characteristics and functionality of said target system and are compatible with and utilized by said simulation tool to simulate said target system; and
- a translation processing module for translating said received simulation system modules into corresponding target modules compatible with said target system, wherein said target modules control said target system to operate in accordance with said target system simulation.

12. The program product apparatus of claim 11 wherein:
said target system includes a communications network;
said simulation tool includes a network simulator to simulate said communications network, wherein said simulation system modules include information indicating a network protocol for use by said communications network; and
said target modules control said communications network to implement said network protocol in accordance with said communications network simulation.

13. The program product apparatus of claim 11 wherein:
said simulation system modules include data simulation modules containing information related to characteristics of said target system and functional simulation modules containing information related to functionality of said target system; and
said translation processing module includes:
- a data translation module for processing said data simulation modules to produce corresponding target modules compatible with said target system; and
- a functional translation module for translating said functional simulation modules into corresponding target modules compatible with said target system.

14. The program product apparatus of claim 13 wherein said functional translation module includes:
- a retrieval module for retrieving each functional simulation module from said received simulation system modules;
- a parsing module for parsing each line of said each retrieved functional simulation module into its individual components;
- a determining module for determining a function of said each parsed line based on its individual components, wherein said determining module includes a component module for retrieving said individual components of said each parsed line successively until sufficient information is retrieved to determine said function of that parsed line;
- a conversion module for converting said each parsed line into a corresponding translated line compatible with said target system in accordance with said determined function of that parsed line; and
- a storage module for storing each translated line associated with a corresponding parsed line in a corresponding target module.

15. The program product apparatus of claim 13 wherein said functional translation module includes:
- a replacement module for replacing specific information within said target modules with information compatible with said target system; and a modification module for modifying information within said target modules pertaining to input/output functions to facilitate input/output functions in a manner compatible with said target system.

16. The program product apparatus of claim 11 wherein said translation processing module includes:

translation data files including information utilized and referenced by said target modules;

a translation function module for translating said simulation system modules into said corresponding target modules;

target template modules for containing target module information and storing corresponding translated simulation system modules received from said translation function module, thereby serving as said target modules; and a simulation function module for emulating simulation system functions on said target system, wherein said target modules access said simulation function module in order to control said target system to perform said simulation system functions.

17. The program product apparatus of claim 11 further including:

a compilation order module for determining a compilation order for said target modules and storing said compilation order in a compilation order file.

18. A carrier signal having computer program logic embedded therein for facilitating production of target modules compatible with a target system from modules utilized by a simulation tool of a simulation system to simulate target system behavior, said carrier signal comprising:

a translation storage module for receiving and storing simulation system modules, wherein said simulation system modules include information indicating characteristics and functionality of said target system and are compatible with and utilized by said simulation tool to simulate said target system; and a translation processing module for translating said received simulation system modules into corresponding target modules compatible with said target system, wherein said target modules control said target system to operate in accordance with said target system simulation.

19. The carrier signal of claim 18 wherein:

said target system includes a communications network;

said simulation tool includes a network simulator to simulate said communications network, wherein said simulation system modules include information indicating a network protocol for use by said communications network; and said target modules control said communications network to implement said network protocol in accordance with said communications network simulation.

20. The carrier signal of claim 18 wherein:

said simulation system modules include data simulation modules containing information related to characteristics of said target system and functional simulation modules containing information related to functionality of said target system; and said translation processing module includes:

a data translation module for processing said data simulation modules to produce corresponding target modules compatible with said target system; and a functional translation module for translating said functional simulation modules into corresponding target modules compatible with said target system.

21. The carrier signal of claim 20 wherein said functional translation module includes:

a retrieval module for retrieving each functional simulation module from said received simulation system modules;

a parsing module for parsing each line of said each retrieved functional simulation module into its individual components;

a determining module for determining a function of said each parsed line based on its individual components, wherein said determining module includes a component module for retrieving said individual components of said each parsed line successively until sufficient information is retrieved to determine said function of that parsed line;

a conversion module for converting said each parsed line into a corresponding translated line compatible with said target system in accordance with said determined function of that parsed line; and a storage module for storing each translated line associated with a corresponding parsed line in a corresponding target module.

22. The carrier signal of claim 20 wherein said functional translation module includes:

a replacement module for replacing specific information within said target modules with information compatible with said target system; and a modification module for modifying information within said target modules pertaining to input/output functions to facilitate input/output functions in a manner compatible with said target system.

23. The carrier signal of claim 18 wherein said translation processing module includes:

translation data files including information utilized and referenced by said target modules;

a translation function module for translating said simulation system modules into said corresponding target modules;

target template modules for containing target module information and storing corresponding translated simulation system modules received from said translation function module, thereby serving as said target modules; and a simulation function module for emulating simulation system functions on said target system, wherein said target modules access said simulation function module in order to control said target system to perform said simulation system functions.

24. The carrier signal of claim 18 further including:

a compilation order module for determining a compilation order for said target modules and storing said compilation order in a compilation order file.

25. A method of producing target modules compatible with a target system from modules utilized by a simulation tool of a simulation system to simulate target system behavior, said method comprising the steps of:

(a) receiving and storing simulation system modules, wherein said simulation system modules include information indicating characteristics and functionality of said target system and are compatible with and utilized by said simulation tool to simulate said target system; and (b) translating said received simulation system modules into corresponding target modules compatible with said target system, wherein said target modules control said target system to operate in accordance with said target system simulation.

26. The method of claim 25 wherein said target system includes a communications network, said simulation tool includes a network simulator to simulate said communications network, and said simulation system modules include information indicating a network protocol for use by said communications network, wherein step (b) further includes:

(b.1) translating said simulation system modules into corresponding target modules, wherein said target modules control said communications network to implement said network protocol in accordance with said communications network simulation.

27. The method of claim 25 wherein said simulation system includes an OPNET simulation tool, and said simulation system modules are compatible with and utilized by said OPNET simulation tool, and step (b) further includes:

(b.1) translating said simulation system modules compatible with said OPNET simulation tool into said corresponding target modules compatible with said target system.

28. The method of claim 25 wherein said target system includes a VxWorks platform, and step (b) further includes:

(b.1) translating said simulation system modules into said corresponding target modules compatible with said target system platform.

29. The method of claim 25 wherein step (b) further includes:

(b.1) storing information utilized and referenced by said target modules in translation data files;

(b.2) translating said simulation system modules into said corresponding target modules;

(b.3) storing target module information and corresponding translated simulation system modules in target template modules serving as said target modules; and (b.4) providing said target modules with access to a simulation function library that emulates simulation system functions on said target system, wherein said target modules access said simulation function library to control said target system to perform said simulation system functions.

30. The method of claim 25 wherein said simulation system modules include data simulation modules containing information related to characteristics of said target system and functional simulation modules containing information related to functionality of said target system, and step (b) further includes:

(b.1) processing said data simulation modules to produce corresponding target modules compatible with said target system; and (b.2) translating said functional simulation modules into corresponding target modules compatible with said target system.

31. The method of claim 30 wherein step (b.2) further includes:

(b.2.1) retrieving each functional simulation module from said received simulation system modules;

(b.2.2) parsing each line of said each retrieved functional simulation module into its individual components;

(b.2.3) determining a function of said each parsed line based on its individual components, wherein individual components of said each parsed line are retrieved successively until sufficient information is retrieved to determine said function of that parsed line;

(b.2.4) converting said each parsed line into a corresponding translated line compatible with said target system in accordance with said determined function of that parsed line; and (b.2.5) storing each translated line associated with a corresponding parsed line in a corresponding target module.

32. The method of claim 30 wherein step (b.2) further includes:

(b.2.1) replacing specific information within said target modules with information compatible with said target system; and (b.2.2) modifying information within said target modules pertaining to input/output functions to facilitate input/output functions in a manner compatible with said target system.

33. The method of claim 25 further including the step of:

(c) determining a compilation order for said target modules and storing said compilation order in a compilation order file.

34. The method of claim 33 further including the step of:

(d) compiling said target modules into a format for execution on said target system in accordance with said compilation order stored in said compilation order file.

* * * * *